United States Patent [19]
Cutts et al.

[11] Patent Number: 5,954,823
[45] Date of Patent: Sep. 21, 1999

[54] REDUNDANT POWER DISTRIBUTION IN AN INFORMATION PROCESSING SYSTEM

[75] Inventors: Stanley John Cutts, Petersfield; David Newmarch, Romsey, both of United Kingdom

[73] Assignee: International Business Machines Corporation, Armonk, N.Y.

[21] Appl. No.: 08/999,896

[22] Filed: Aug. 12, 1997

Related U.S. Application Data

[63] Continuation of application No. 08/556,555, Nov. 13, 1995, abandoned.

[51] Int. Cl.$^6$ .............................. G06F 1/30; G06F 1/00
[52] U.S. Cl. ........................................... 714/14; 713/300
[58] Field of Search ............................ 713/300; 714/14

[56] References Cited

U.S. PATENT DOCUMENTS

| | | | |
|---|---|---|---|
| 4,717,982 | 1/1988 | Toreson et al. | 360/137 |
| 5,195,022 | 3/1993 | Hoppal et al. | 361/391 |
| 5,325,363 | 6/1994 | Lui | 371/8.1 |
| 5,452,277 | 9/1995 | Bajorek et al. | 369/54 |

*Primary Examiner*—Ayaz R. Sheikh
*Assistant Examiner*—Jigar Pancholi
*Attorney, Agent, or Firm*—John A. Merecki; Schmeiser, Olsen & Watts

[57] ABSTRACT

An information processing system comprises a plurality of information processing devices; and a fault-tolerant power distribution system comprising a plurality N+1, wherein N is greater than 1, removable power supplies for providing power to the system, N power supplies being sufficient to provide power to the plurality of devices; and a plurality M removable power distribution units for connecting the power supplies to the devices, the connection of the power supplies with the power distribution units being configured such that on removal of either of the units, the remaining unit is still connected to N of the power supplies to thereby maintain power to the system.

20 Claims, 5 Drawing Sheets

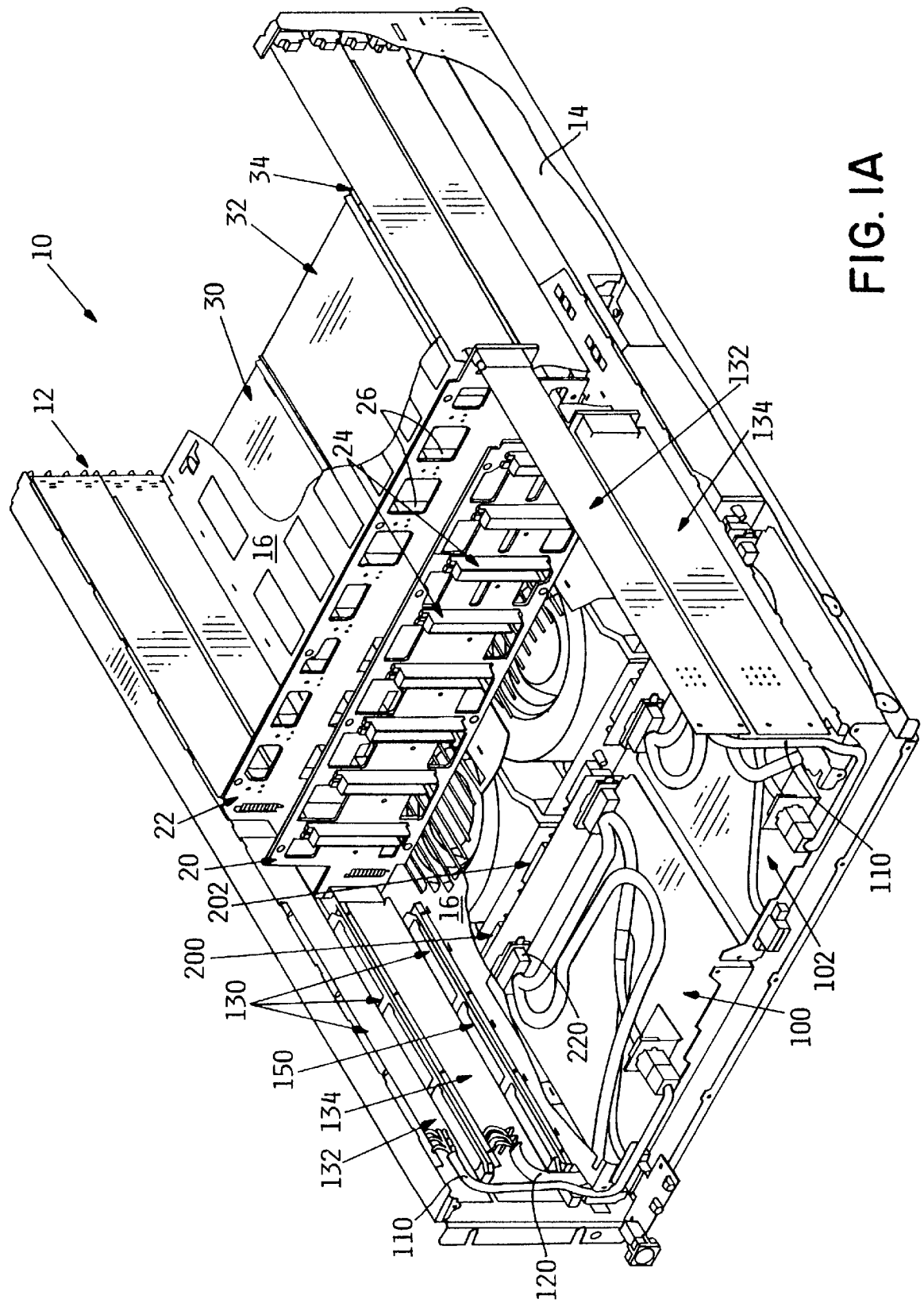
FIG. IA

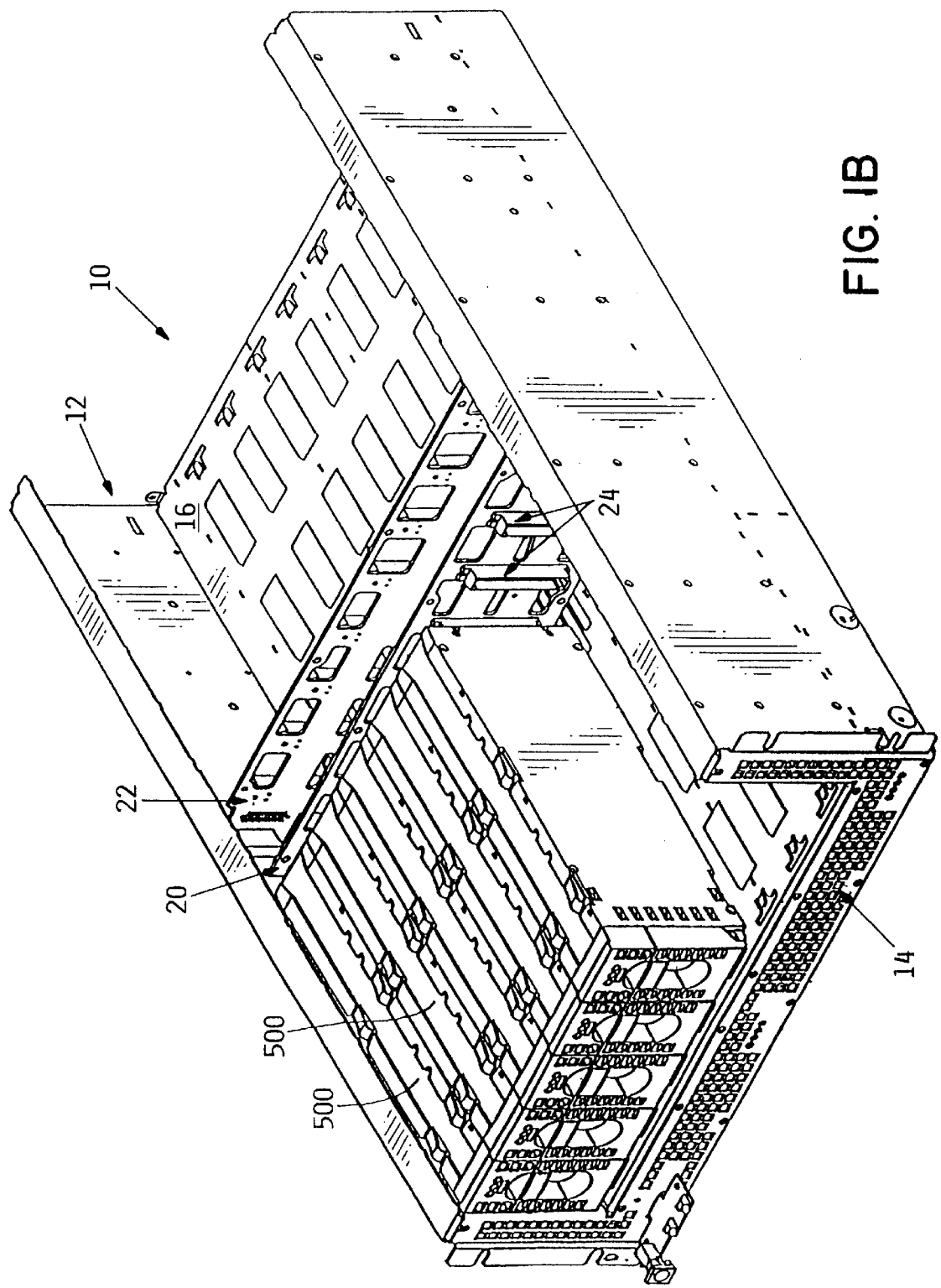
FIG. IB

REDUNDANT POWER DISTRIBUTION IN AN INFORMATION PROCESSING SYSTEM

This application is a continuation of application Ser. No. 08/556,555, filed Nov. 13, 1995, now abandoned.

TECHNICAL FIELD OF THE INVENTION

The present invention relates to the provision of power to replaceable electrical units within an information processing system.

BACKGROUND OF THE INVENTION

A current trend in the design of electrical systems is to modular system configurations wherein individual electrical units of the system are readily accessible and in some cases customer removable. The use of modular designs provides a number of different advantages. Manufacture and assembly is made simpler in that each unit can be manufactured and tested separately before being assembled in the complete system. Furthermore, if a removable unit becomes defective, it can be readily removed for repair and replaced with a working device. A typical multicomponent system of this type is a computing system in which data storage devices, processing hardware, power supplies and cooling fans are contained within a single support structure.

Although ease of removability of individual devices is facilitated using a modular configuration, the removal and replacement of a device usually requires the system to be closed down thus reducing the amount of time for which the system is available. Systems are now coming onto the market which allow for concurrent maintenance, i.e., provision is made to allow removal of a defective device whilst allowing continued operation of remaining elements of the system.

Taking the example of a disk file data storage system comprising removable disk files and associated power and cooling units, such systems are currently available which allow for the replacement of one or more of the disk files while maintaining operation of the remaining disk files. Furthermore EP-A-617 570 describes a data storage system including replaceable cooling and power assemblies; the system housing being configured to permit removal of these assemblies without the need to remove the disk files. Although ease of access to various subassemblies within a modular electronic system is a prerequisite to achieving the desired aim of concurrent maintainability, it is also necessary to build redundancy into the system so that removal of a defective device providing a system life support function, e.g., a power supply does not result in shortage of power to the system.

Concurrent maintenance of power supplies and/or signal paths between modules in a modular system can be achieved by creating independent removable dual paths. However this technique is not easy to apply where the paths cannot be separated, as in an electronics board or backplane in a storage subsystem, where it becomes necessary to remove sections of the backplane without disrupting the signals or power within the subsystem.

However, it is a continuing technical challenge to design modular electronic systems which provide ease of assembly and disassembly to give low manufacturing and service cost and at the same time achieve the high levels of fault tolerance which are becoming an increasingly important requirement in modem data storage systems.

DISCLOSURE OF THE INVENTION

The present invention seeks to address the problem of providing concurrent maintenance of power and/or signal paths and accordingly provides an information processing system comprising: a plurality of information processing devices; a fault-tolerant power distribution system comprising a plurality N+1, wherein N is greater than 1, removable power supplies for providing power to the system, N power supplies being sufficient to provide power to said plurality of devices; and a plurality M removable power distribution units for connecting said power supplies to said devices, the connection of said power supplies with said power distribution units being configured such that on removal of either of said units, the remaining unit is still connected to N of said power supplies to thereby maintain power to said system.

A preferred system includes three independently removable power supplies and a pair of power distribution means, wherein each of said power distribution means includes a pair of input sockets located on an outwardly facing surface thereof and each of said three power supplies includes a pair of output connectors on an outwardly facing edge thereof, said power supplies being arranged side-by-side in a housing of said system such that the six output connectors are presented in a row for connection to said power distribution means input sockets, whereby one of the output connectors on each of the two outer power supplies connects to one socket of one of the power distribution means and the other socket of each power distribution means connects to one of the two connectors of the central power supply.

The power distribution means can take one of a number of forms, including a cable assembly mounted on a tray. If it is desired that the power distribution means carry more than power signals, e.g., other data or control signals, it may advantageously take the form of an electronic circuit card.

A preferred embodiment of the invention will now be described, by way of example only, with reference to the accompanying drawings.

BRIEF DESCRIPTION OF THE DRAWINGS

FIGS. 1A and 1B show the interior of a data storage subsystem housing as viewed from the front and right sides;

DETAILED DESCRIPTION OF THE INVENTION

Figure 2:
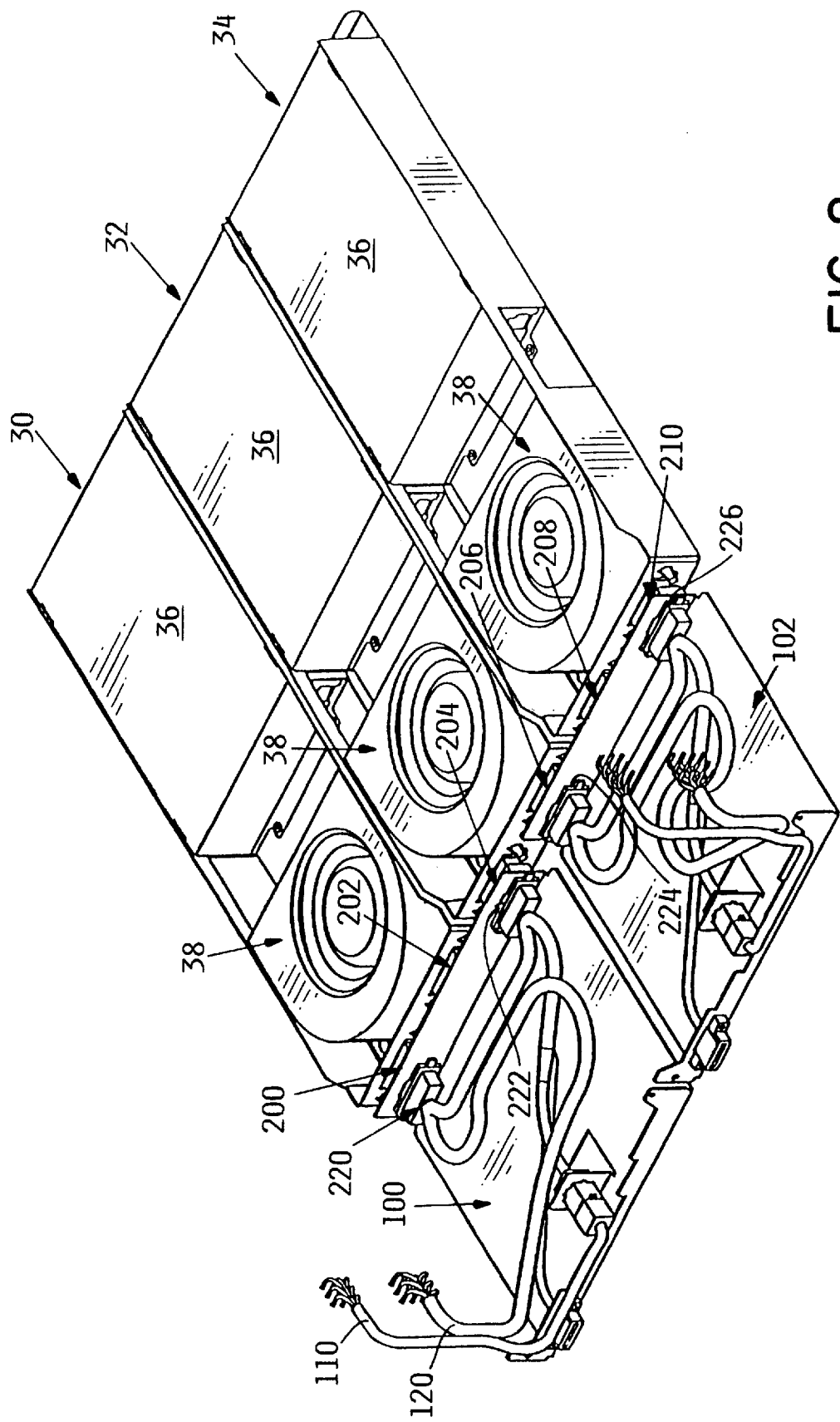
FIG. 2 is a front perspective view of three combined power supply/fan modules and a pair of power distribution assemblies, interconnected according to a first embodiment of the invention.

Referring first to FIGS. 1A and 1B there are shown front perspective views of a data storage subsystem housing 10, cut-away to reveal various elements of the power distribution system for providing power and other signals to a plurality of individual data storage devices, e.g., disk drives 500. The housing is divided internally into upper 12 and lower 14 compartments by a shelf 16 extending the length of the housing. In FIG. 1A, most of the front portion of the shelf 16 is cut-away for the purposes of clarity to reveal the various elements residing in the lower compartment, including the power distribution system.

The removable disk data storage devices 500 are housed in two groups, front and rear, in the upper compartment. Two backplanes 20, 22 are centrally located in the upper compartment to provide power and data signal connection to the storage devices. The front group of storage devices plugs into a bank of connectors 24 (one connector per device) mounted on backplane 20 (as shown in FIG. 1B) and the rear group of storage devices plugs into a bank of connectors 26 (one connector per device) mounted on backplane 22.

In the rear and central portion of the lower compartment are mounted three combined power supply and cooling fan modules 30, 32, 34 seen to better effect in FIG. 2. Each module comprises a power supply unit 36 and a fan unit 38 mounted on a common carrier 40. The modules are removable for repair or replacement via the rear of the housing. In order to achieve concurrent maintenance of the data storage system, one of these replaceable modules is redundant in the sense that sufficient power and cooling of the system is provided for the whole system by two of the modules. Thus on a failure of a power supply or fan of one of the modules, the defective module may be removed whilst permitting continued operation of the system.

Located at the front portion of the lower compartment are two power distribution assemblies, which in FIG. 1A take the form of cable assembly trays 100, 102. These assemblies are removable from the front of the housing. The power distribution system of the data storage system is dual ended so that distribution of power to all drives is achieved when only one of these assemblies is connected in the housing. Accordingly, on failure of one of the assemblies, the configuration of power supplies and power distribution assemblies shown in FIG. 1A allow concurrent maintenance of the system to be carried out.

In FIG. 1A, a pair of power cables 110, 120 from each of the power distribution assemblies 100, 102 extend toward the side walls of the housing for connection to a pair of side cards 132, 134 mounted on guide brackets 130 fixed to the side-wall. Side card 134 provides distribution of power from cable 120 to backplane 20 and hence to disk storage devices attached thereto. Side card 132 provides power distribution from cable 110 to backplane 22 and hence to disk storage devices mounted in the rear of the upper compartment. It can be seen that backplane 20 includes a notch at each side edge, through which each side card 132 passes to backplane 22. Cooling holes 150 are provided in guidance bracket 130 to allow cooling of the side cards.

The interconnection of modules 30, 32 and 34 with power distribution assemblies 100, 102 is shown in FIG. 2. Each module includes two output power connectors 200, 202, 204, 206, 208, 210 at its front face which auto-dock to receiving sockets 220, 222, 224 and 226 on the assemblies. For the sake of clarity, power cabling from the power supply of each module to the output connectors has been omitted from FIG. 2. As can be seen in FIG. 2, the configuration and arrangement of the modules and assemblies is such that the left hand output connector 200 of module 30 connects to the left hand receiving socket 220 of assembly 100. The left hand output connector 204 of module 32 connects to the right hand receiving socket 222 of assembly 100. The right hand output connector 206 of module 32 connects to the left hand socket 224 of assembly 102. The right hand connector 210 of module 34 is connected to the right hand socket 226 of assembly 102. Thus the power module 32 connects to both of the power distribution modules that distribute power to the system.

In the event that any of the three modules 30, 32 or 34 is removed from the system for maintenance, the remaining two modules will provide power to both power distribution assemblies and thence to all disk storage devices in the system. In the event that one of the two assemblies 100, 102 is removed from the system, the remaining assembly is still connected to two of the three power modules and thus sufficient power is provided from the two modules through the remaining assembly to the system.

Figure 3:
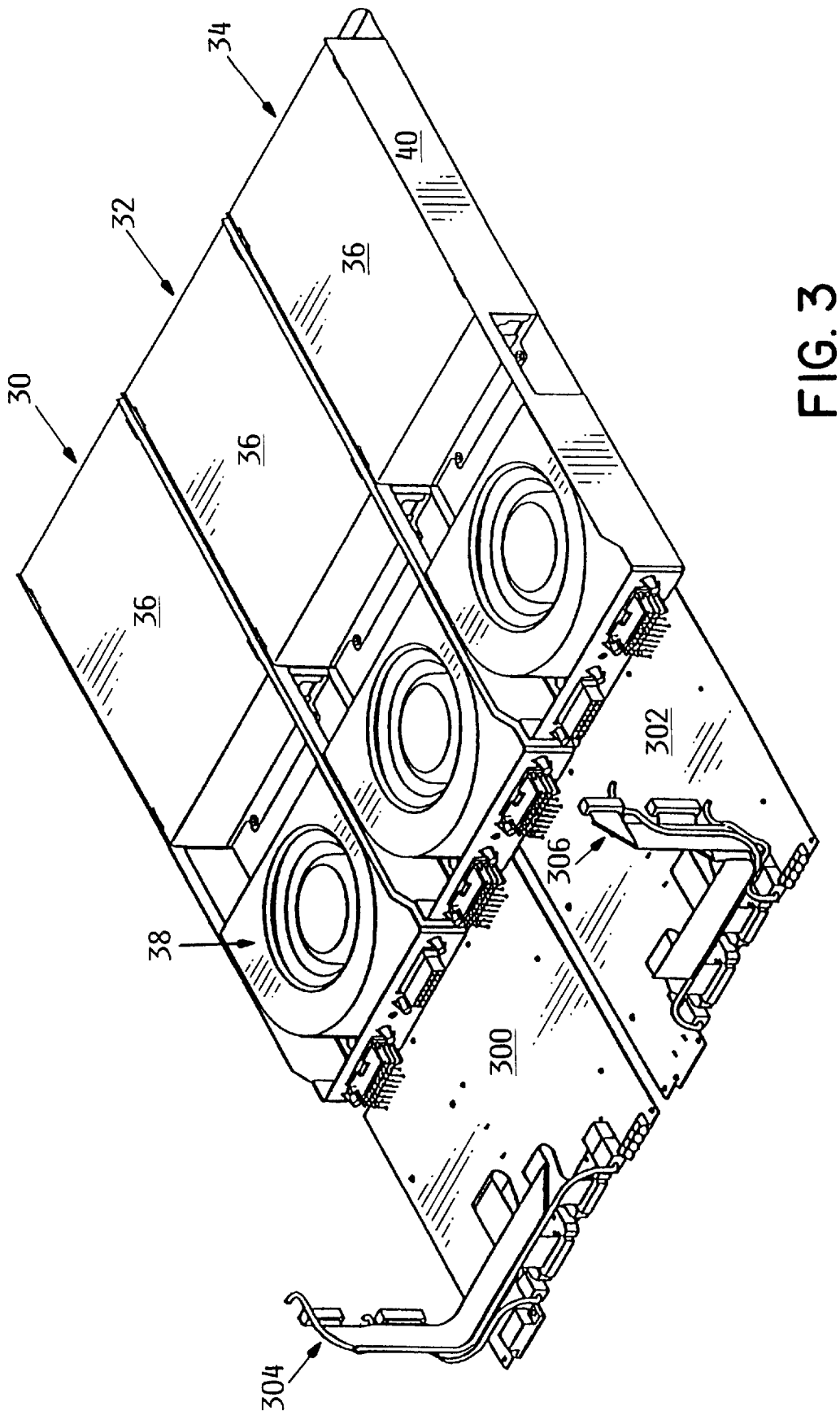
FIG. 3 shows an exploded view showing the power supply/fan modules of FIG. 2 interconnected to two power distribution cards according a second embodiment of the present invention.

FIG. 3 shows an alternative power distribution arrangement wherein each assembly takes the form of an electronic card 300, 302. This alternative may be useful in systems where it is required for the assemblies to carry other functions besides power distribution. Cabling 304, 306 at the front of each card distributes power to the side cards in a similar manner to that already described in relation to FIG. 1.

Figure 4:
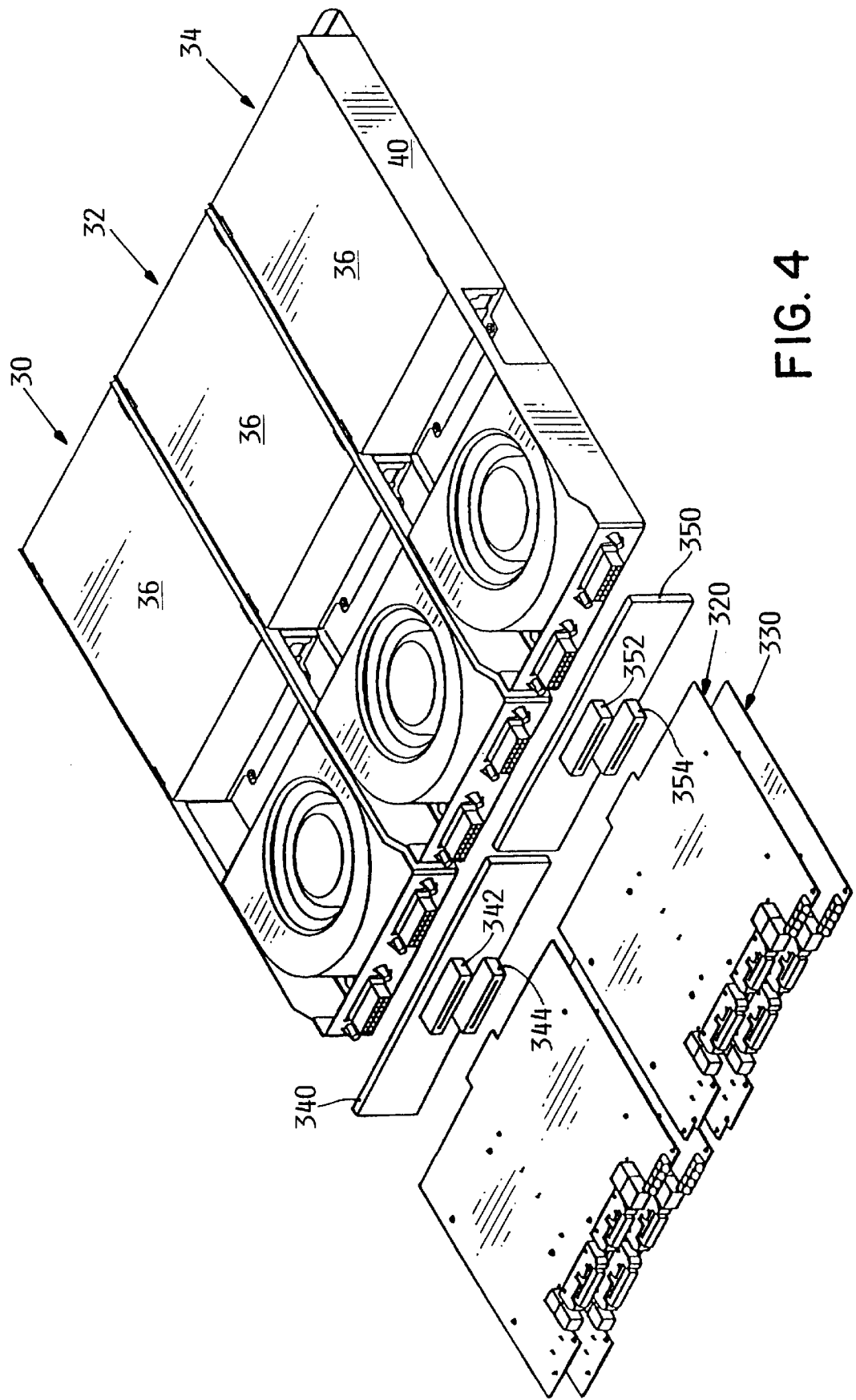
FIG. 4 shows the interconnection of power supply/fan subassemblies and power distribution cards according to a third embodiment of the present invention.

FIG. 4 shows a further alternative arrangement wherein the power distribution assemblies take the form of two pairs of electronic cards 320, 330. Interconnection between the modules and the cards is achieved via a two-part intermediate bulkhead 340, 350 which extends the width of the housing. A pair of connectors 342, 344 and 352, 354 is provided on each part of the bulkhead, into which the electronic cards are connected.

Although the above embodiment has been described in the context of a dual ended power distribution configuration, it will be appreciated that it is equally applicable to ring or buss type power/data paths in which environments 100% concurrent maintenance is achievable.

We claim:

1. An information processing system comprising:
   a plurality of information processing devices;
   a fault-tolerant power distribution system comprising a plurality of at least N+1 removable power supplies for providing power to the information processing system, N power supplies being sufficient to provide power to said plurality of information processing devices; and
   a plurality of M removable power distribution means for connecting said power supplies to said information processing devices, the connection of said power supplies with said removable power distribution means being configured to allow, in a first case, removal of one of said removable power supplies while maintaining power to said plurality of information processing devices and said information processing system, and in a second case, removal of one of said removable power distribution means while maintaining power to said plurality of information processing devices and said information processing system.

2. An information processing system as claimed in claim 1, wherein N=2 and M=2.

3. The information processing system as claimed in claim 1, wherein the devices are disk data storage devices.

4. The information processing system as claimed in claim 1, wherein each of said plurality of removable power distribution means takes the form of cable assembly tray.

5. An information processing system as claimed in claim 1, wherein each of said M removable power distribution means includes a pair of input sockets, and each of said N+1 power supplies includes a pair of output connectors, said input sockets electrically connected to said output connectors.

6. The information processing system as claimed in claim 5, wherein the devices are disk data storage devices.

7. The information processing system as claimed in claim 5, wherein each of said plurality of removable power distribution means takes the form of cable assembly tray.

8. The information processing system of claim 5 wherein the input sockets are on an outwardly facing edge of the removable power distribution means.

9. The information processing system as claimed in claim 8, wherein the devices are disk data storage devices.

10. The information processing system as claimed in claim 8, wherein each of said plurality of removable power distribution means takes the form of cable assembly tray.

11. The information processing system of claim 5 wherein said power supplies are side-by-side in a housing of said system such that the output connectors are presented in a row for connection to said removable power distribution means input sockets.

12. The information processing system as claimed in claim 11, wherein the devices are disk data storage devices.

13. The information processing system as claimed in claim 11, wherein each of said plurality of removable power distribution means takes the form of cable assembly tray.

14. The information processing system as claimed in claim 11, further comprising an intermediate bulkhead located between said power supplies and said removable power distribution means.

15. The information processing system of claim 11, whereby one of the output connectors on said N power supplies connects to each of said M removable power distribution means and both of the output connectors on one power supply connect to each of said M removable power distribution means.

16. The information processing system as claimed in claim 15, wherein the devices are disk data storage devices.

17. The information processing system as claimed in claim 15, wherein each of said plurality of removable power distribution means takes the form of cable assembly tray.

18. The information processing system as claimed in claim 15, further comprising an intermediate bulkhead located between said power supplies and said removable power distribution means.

19. An information processing system comprising:

a plurality of information processing devices;

a fault-tolerant power distribution system comprising a plurality of at least N+1 removable power supply and cooling fan modules, N power supply and cooling fan modules being sufficient to provide power to said plurality of information processing devices; and a plurality of M removable power distribution means for connecting said power supply and cooling fan modules to said information processing devices, the connection of said power supply and cooling fan modules with said removable power distribution units being configured to allow, in a first case, removal of one of said removable power supply and cooling fan modules while maintaining power to said plurality of information processing devices and said information processing system, and in a second case, removal of one of said removable power distribution means while maintaining power to said plurality of information processing devices and said information processing system.

20. An information processing system comprising:

a plurality of information processing devices;

a fault-tolerant power distribution system comprising a plurality of at least N+1 removable power supplies, N power supplies being sufficient to provide power to said plurality of information processing devices; and a plurality of M removable power distribution means for connecting said power supplies to said information processing devices, the connection of said power supplies with said removable power distribution units being configured to allow, in a first case, removal of one of said removable power supplies while maintaining power from N power supplies to said plurality of information processing devices and said information processing system, and in a second case, removal of one of said removable power distribution means while maintaining power from N power supplies to said plurality of information processing devices and said information processing system.

* * * * *